United States Patent
Lin et al.

(10) Patent No.: US 9,780,060 B2
(45) Date of Patent: Oct. 3, 2017

(54) PACKAGED IC WITH SOLDERABLE SIDEWALLS

(71) Applicant: TEXAS INSTRUMENTS INCORPORATED, Dallas, TX (US)

(72) Inventors: Yong Lin, Plano, TX (US); Vikas Gupta, Dallas, TX (US); Rongwei Zhang, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/368,413

(22) Filed: Dec. 2, 2016

(65) Prior Publication Data

US 2017/0162530 A1     Jun. 8, 2017

Related U.S. Application Data

(60) Provisional application No. 62/262,568, filed on Dec. 3, 2015.

(51) Int. Cl.
| | |
|---|---|
| *H01L 23/00* | (2006.01) |
| *H01L 23/495* | (2006.01) |
| *H01L 23/31* | (2006.01) |
| *H01L 21/48* | (2006.01) |
| *H01L 21/56* | (2006.01) |
| *H01L 21/78* | (2006.01) |

(Continued)

(52) U.S. Cl.
CPC ............ *H01L 24/29* (2013.01); *H01L 21/304* (2013.01); *H01L 21/4825* (2013.01); *H01L 21/565* (2013.01); *H01L 21/78* (2013.01); *H01L 23/3114* (2013.01); *H01L 23/4952* (2013.01); *H01L 23/49503* (2013.01); *H01L 23/49541* (2013.01); *H01L 23/544* (2013.01); *H01L 24/27* (2013.01); *H01L 2221/68327* (2013.01); *H01L 2223/54426* (2013.01); *H01L 2223/54453* (2013.01); *H01L 2224/2732* (2013.01); *H01L 2224/27318* (2013.01); *H01L 2224/27848* (2013.01); *H01L 2224/29034* (2013.01); *H01L 2224/29111* (2013.01); *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/29169* (2013.01)

(58) Field of Classification Search
CPC ......... H01L 2221/68327; H01L 23/544; H01L 21/304; H01L 2223/54426; H01L 2223/54453

See application file for complete search history.

(56) References Cited

U.S. PATENT DOCUMENTS 9,455,244 B2 *  9/2016  Shin .................... H01L 24/17
9,595,485 B2 *  3/2017  Vincent ............... H01L 25/50
(Continued)

*Primary Examiner* — Ngan Ngo
(74) *Attorney, Agent, or Firm* — Rose Alyssa Keagy; Charles A. Brill; Frank D. Cimino

(57) ABSTRACT

A packaged IC wherein a portion of the sidewalls of the packaged IC are solderable metal. A method of forming a packaged IC wherein a portion of the sidewalls of the wire bond pads or the flip chip pads that are exposed by sawing during singulation are solderable metal. A method of forming a packaged IC wherein all of the sidewalls of the wire bond pads or the flip chip pads that are exposed by sawing during singulation are solderable metal and a portion of sidewall of the molding compound is solderable metal.

12 Claims, 13 Drawing Sheets

(51) Int. Cl.
*H01L 23/544* (2006.01)
*H01L 21/304* (2006.01)

(56) References Cited

U.S. PATENT DOCUMENTS

| | | | | |
|---|---|---|---|---|
| 2011/0241190 A1* | 10/2011 | Elian | ........................ | H01L 21/56 257/676 |
| 2014/0054796 A1* | 2/2014 | Gong | .................. | H01L 25/0657 257/777 |
| 2014/0077363 A1* | 3/2014 | Lin | ......................... | H01L 22/14 257/737 |

* cited by examiner

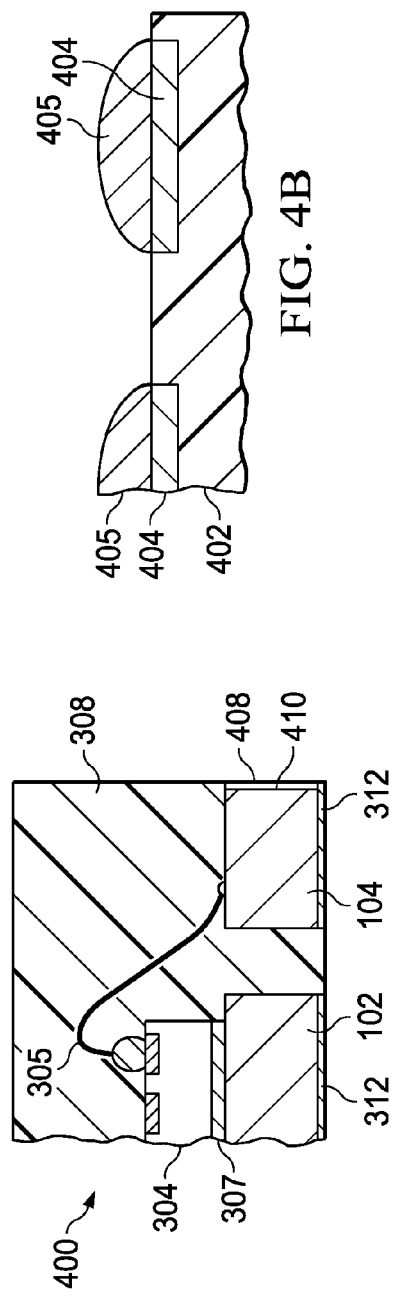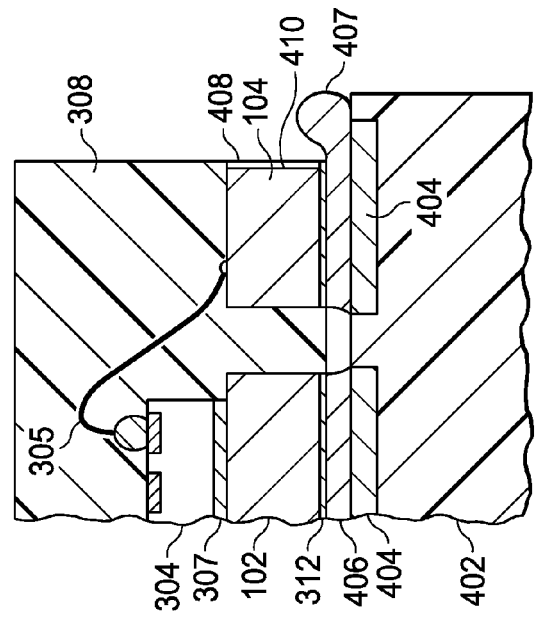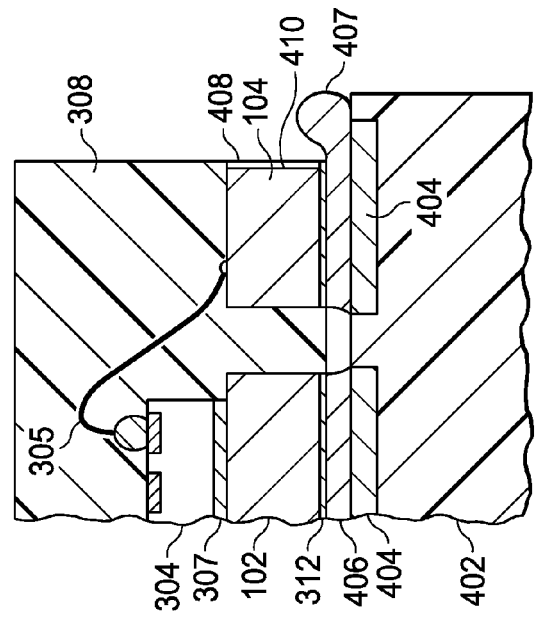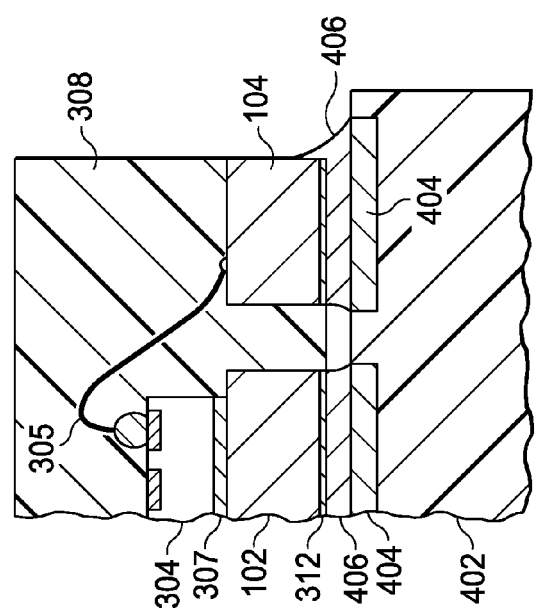

PACKAGED IC WITH SOLDERABLE SIDEWALLS

CROSS REFERENCE TO RELATED APPLICATIONS

This application claims the benefit of priority under U.S.C. §119(e) of U.S. Provisional Application 62/262,568 ("Creating Wettable Surface on Integrated Circuit Lead Finishes", filed Dec. 3, 2015.)

FIELD

Embodiments of the invention are directed, in general, to packaging of integrated circuit (IC) chips and, more specifically, forming solderable sidewalls on packaged IC chips.

DESCRIPTION OF THE VIEWS OF THE DRAWINGS

FIGS. 4A, 4B, 4C, and 4D describe the attachment of a packaged IC to a circuit board by soldering.

DETAILED DESCRIPTION OF EXAMPLE EMBODIMENTS

Embodiments of the disclosure are described with reference to the attached figures. The figures are not drawn to scale and they are provided merely to illustrate the disclosure. Several aspects of the embodiments are described below with reference to example applications for illustration. It should be understood that numerous specific details, relationships, and methods are set forth to provide an understanding of the disclosure. One skilled in the relevant art, however, will readily recognize that the disclosure can he practiced without one or more of the specific details or with other methods. In other instances, well-known structures or operations are not shown in detail to avoid obscuring the disclosure. The embodiments are not limited by the illustrated ordering of acts or events, as some acts may occur in different orders and/or concurrently with other acts or events. Furthermore, not all illustrated acts or events are required to implement a methodology in accordance with the present disclosure.

Figure 1A:
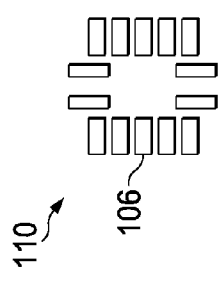
FIGS. 1A and 1B are plan views of lead frames.
Figure 2A:
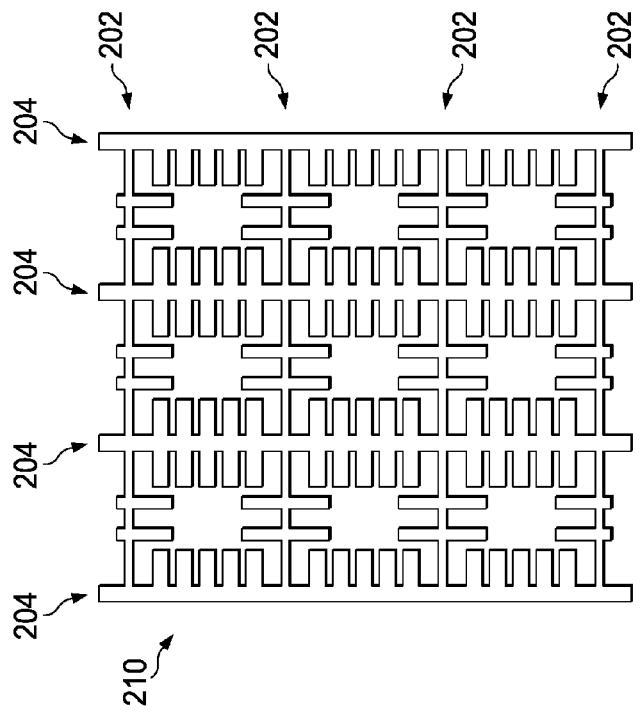
FIGS. 2A and 2B are plan views of a lead frame strips.

For the purposes of this description, the term "lead frame strip" is understood to refer to a plurality of lead frames (FIG. 1A) coupled together by horizontal 202 and vertical 204 saw streets (FIG. 2A).

The term "packaged IC" is understood to refer to an IC chip attached to a lead frame and encapsulated with molding compound.

The term "solderable metal" is understood to refer to metals which solder wets readily. Examples include silver, gold, nickel, palladium, tin, solder and alloys thereof and an ink or paste comprised of a matrix containing solderable metal particles. The matrix may be a material such as a polyimide or epoxy resin or a solder flux.

Packaged ICs such as Small Outline No-Lead (SON) and Quad Flat No-Lead (QFN) ICs are typically fabricated by first attaching IC chips to a metal lead frame strip, encapsulating them with molding compound, and then singulating the encapsulated IC chips by sawing them apart along saw streets to form individual packaged ICs.

Figure 1B:
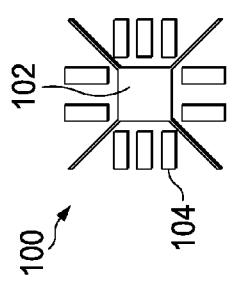

The lead frame strip 200 (FIG. 2A) for a packaged wire bonded IC 300 (FIG. 3A) is typically laid out to include for each wire bond lead frame 100 (FIG. 1A) an IC chip pad 102 and coordinated wire bond pads 104 also referred to as lead frame pads. The lead frame strip 210 (FIG. 2B) for a packaged flip chip IC 301 (FIG. 3B) is typically laid out to include for each Clip chip lead frame 110 (FIG. 1B) coordinated flip chip pads 106 also referred to as lead frame pads.

Figure 2B:
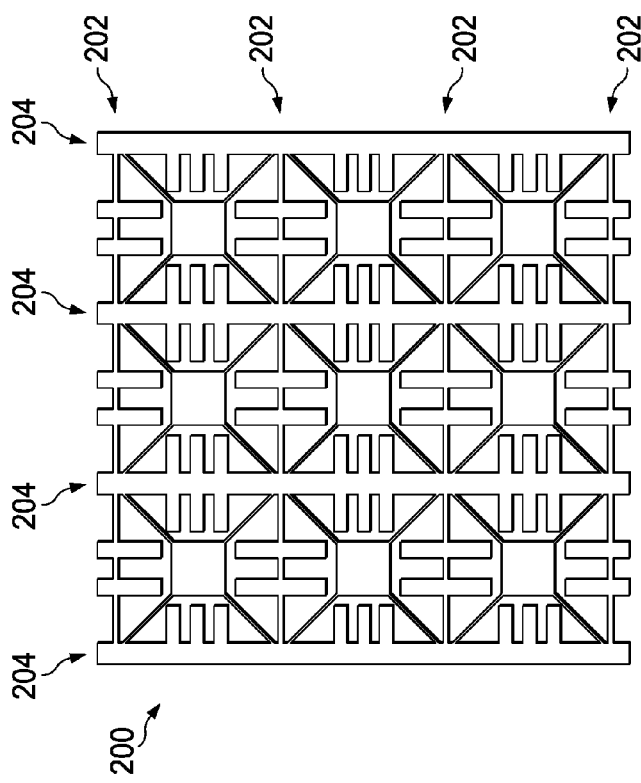

In FIGS. 2A and 2B, lead frame strips, 200 and 210, are commonly formed by connecting multiple lead frames 100 or 110 together with horizontal 202 and vertical 204 saw street metal strips. These saw street metal strips, 202 and 204 are later removed by sawing (singulation) to produce individual packaged ICs.

Lead frame strips 200 and 210 are typically made of a base metal such as copper or a copper alloy. The lead frame strips, 200 and 210, may be plated with layers of solderable metal, such as a layer of nickel followed by a layer of palladium to prevent oxidation of the base metal to facilitate soldering.

Figure 3A:
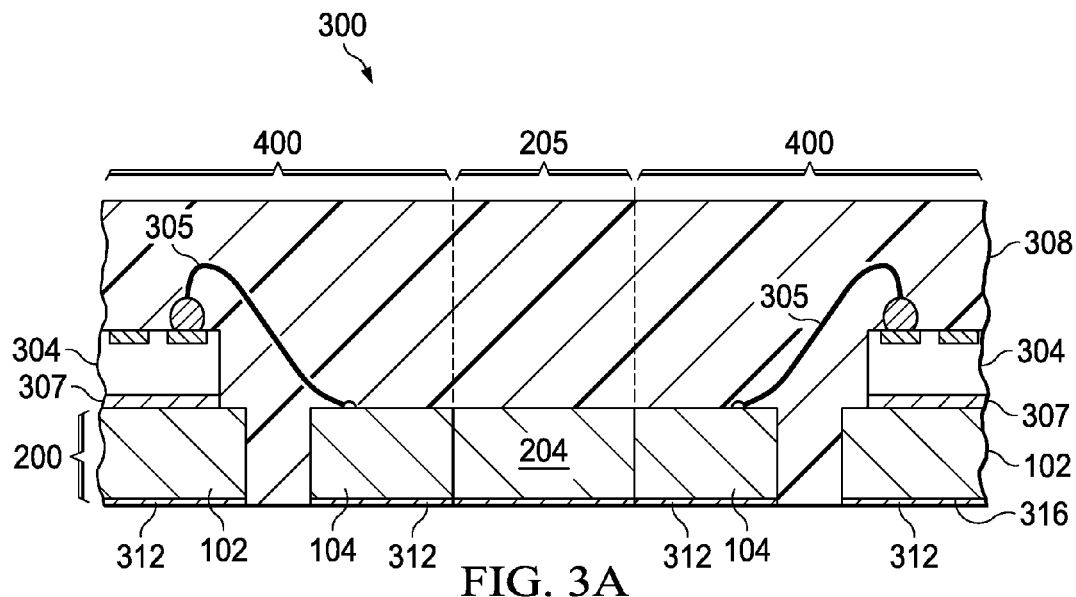
FIGS. 3A and 3B are cross-sections of IC chips on lead frame strips prior to singulation.

A cross section of a lead frame strip 200 with attached IC chips 304 is illustrated in FIG. 3A. IC chips 304 are mounted on the IC chip pads 102 with a conductive epoxy or solder 307. In addition, IC chips 304 are electrically connected to the wire bond pads 104 with wire bonds 305. Wire bond pads 104 from adjacent lead frames 100 are attached to opposite sides of a saw street metal strip 204. The mounted IC chips 304, IC chip pads 102, wire bond pads 104 and saw street metal strips 204 are encapsulated with molding compound 308. The bottom surface 316 of the packaged wire bond IC strip 300 typically is covered with a bottom solderable metal 312 that remains exposed to enable individual packaged wire bond ICs to be soldered to a circuit board. Individual packaged wire bond ICs 400 (FIG. 4A) may then be singulated by sawing through the saw street metal strip 204 and sawing through the molding compound 308 in the saw street 205.

Figure 3B:
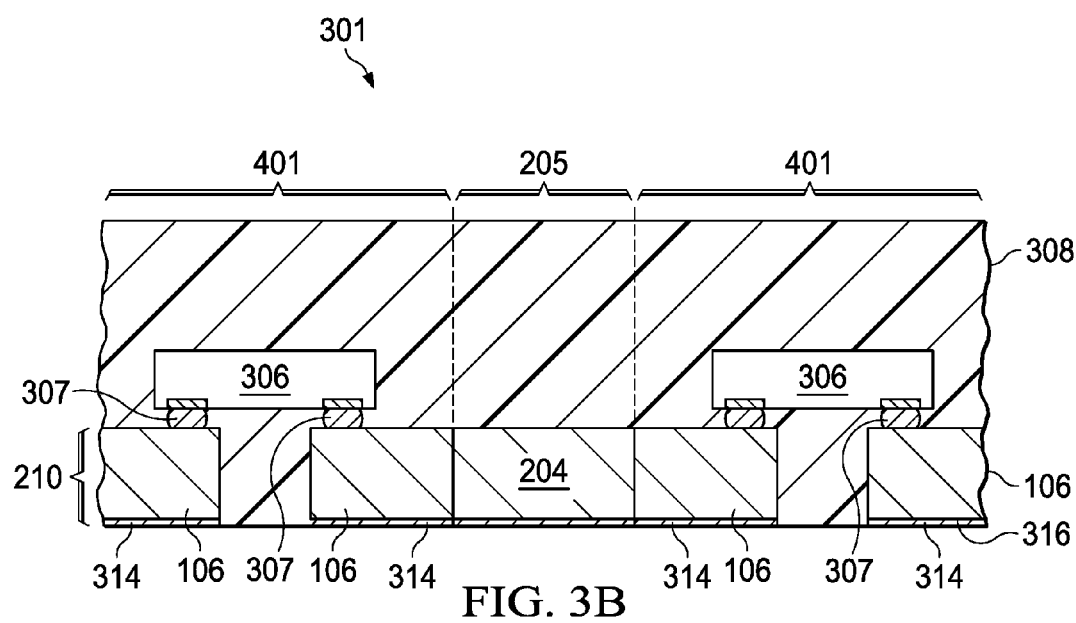

A cross section of a lead frame strip 210 with IC flip chips 306 is illustrated in FIG. 3B. IC flip chips 306 are integrated circuit chips that are flipped upside down and soldered to flip chip pads 106, typically using solder joints 307. Flip chip pads 106 from adjacent lead frames 110 are connected to opposite sides of a saw street metal strip 204. The IC flip chips 306, flip chip pads 106, and saw street metal strips 204 are encapsulated with molding compound 308 to form the packaged flip chip IC strip 301. The bottom surface 316 of the packaged flip chip IC strip 301 is typically covered with bottom solderable metal 314 that remains exposed to enable individual packaged flip chip ICs to be soldered to a circuit hoard. Individual flip chip ICs 401 (FIG. 4B) may then be singulated by sawing through the saw street metal strip 204 and sawing through the molding compound 308 in the saw street 205.

An individual packaged wire bond IC 400 after singulation is shown in FIG. 4A. The sidewall 410 of the wire bond pad 104 is exposed during the singulation process. A metal oxide 408 may form the sidewall 410 when exposed to air.

This metal oxide 408 may prevent solder from wetting the sidewall 410 and forming a reliable solder joint 406.

A circuit board 402 with solder paste 405 on circuit board leads 404 is shown in FIG. 4B. In FIG. 4C, a packaged wire bond IC 400 is attached to the circuit board 402 with solder joints 406 between the circuit board leads 404 and the bottom solderable material 312 covering the bottom of the wire bond pads 104 and the IC chip pads 102.

As shown in FIG. 4C, if the oxidized metal 408 is adequately removed from the sidewall 410 prior to soldering then, a reliable solder joint 406 may be formed where the solder wets the sidewall 410 of the wire bond pad 104.

If the oxidized metal 408 is not adequately removed from the sidewall 410 of the wire bond pads 104 prior to soldering than an unreliable solder joint 407 may be formed. As is shown in FIG. 4D, the solder does not wet the sidewall 410 when the oxidized metal 408 is present. An unreliable solder joint 407 may lead to delamination of the packaged wire bond IC 400 from the circuit board 402.

Figure 5A:
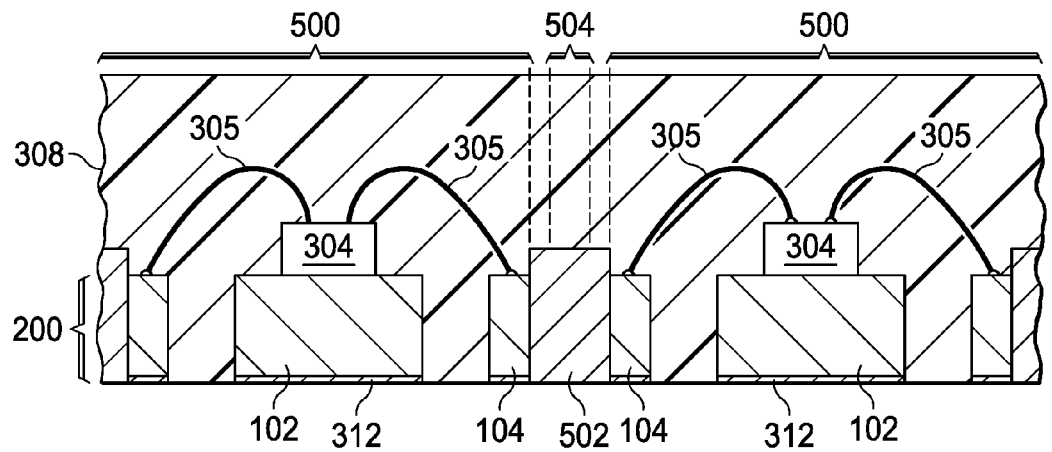
FIGS. 5A, 5B, and 5C describe a packaged IC with solderable sidewalls formed according to embodiments.
Figure 5B:
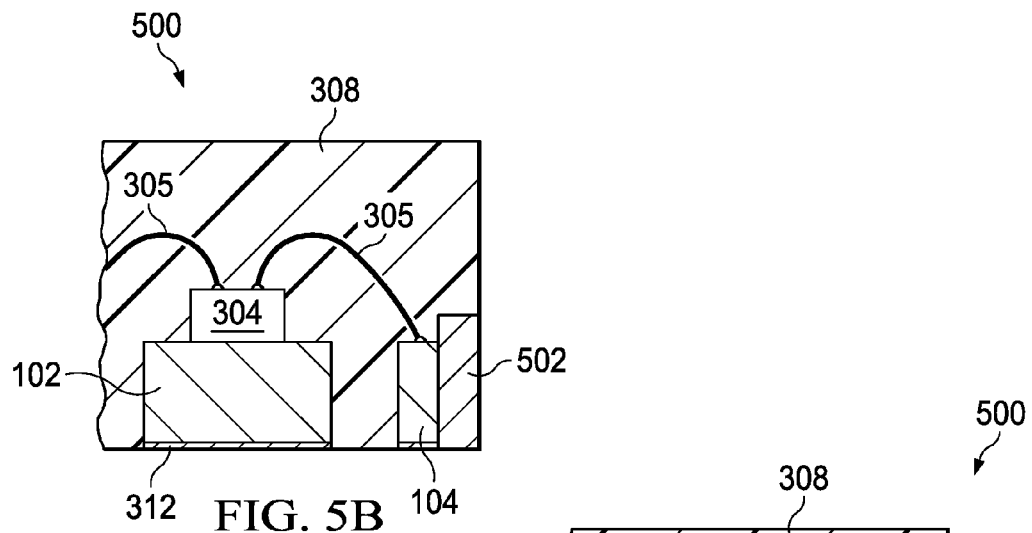

FIG. 5B shows a packaged wire bond IC 500 with solderable metal 502 (metal that solder readily wets) on the sidewall of the wire bond pad 104 that is exposed during singulation. The embodiment is illustrated using a packaged wire bonded IC 500 but generally applies to all packaged ICs that are formed using lead flame strips. For example, an embodiment packaged flip chip IC with solderable metal 502 on the sidewall of the flip chip pad 106 may also be used for illustration. The solderable metal 502 may be a metal such as silver, gold, nickel, palladium, tin, solder or an alloy such as AgSn.

FIG. 5A shows a cross section of a lead frame strip 200 with packaged wire bond ICs 500 prior to singulation by sawing through the saw street 504. In this example, the saw street metal strip 204 (FIG. 3A) plus a portion of the wire bond pads 104 attached to opposite sides of the saw street metal strip 204 are replaced with solderable metal 502.

Figure 5C:
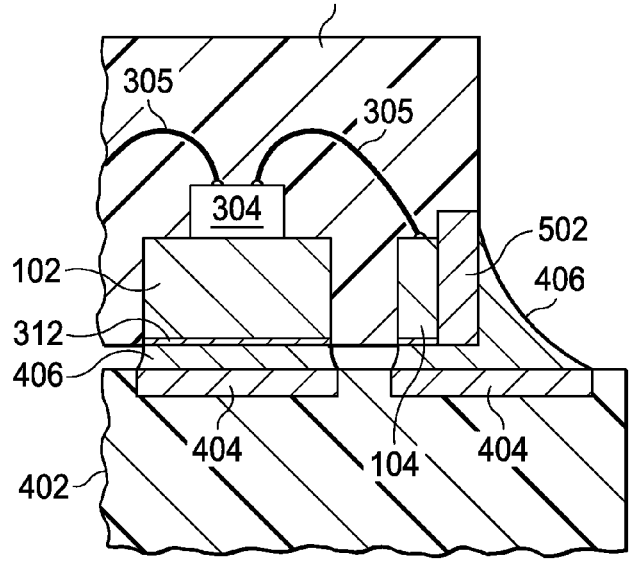

As shown in FIG. 5B the packaged wire bond IC 500 may be singulated by sawing through the saw street 504. During singulation the solderable metal 502 on the sidewalls of the wire bond pads 104 is exposed. As shown in FIG. 5C, solder wets this solderable metal 502 forming a strong solder joint 406 between the solderable metal 502, the bottom solderable metal 312 covering the bottom of the wire hood pad 104, and the lead 404 on the circuit board 402.

Figure 6A:
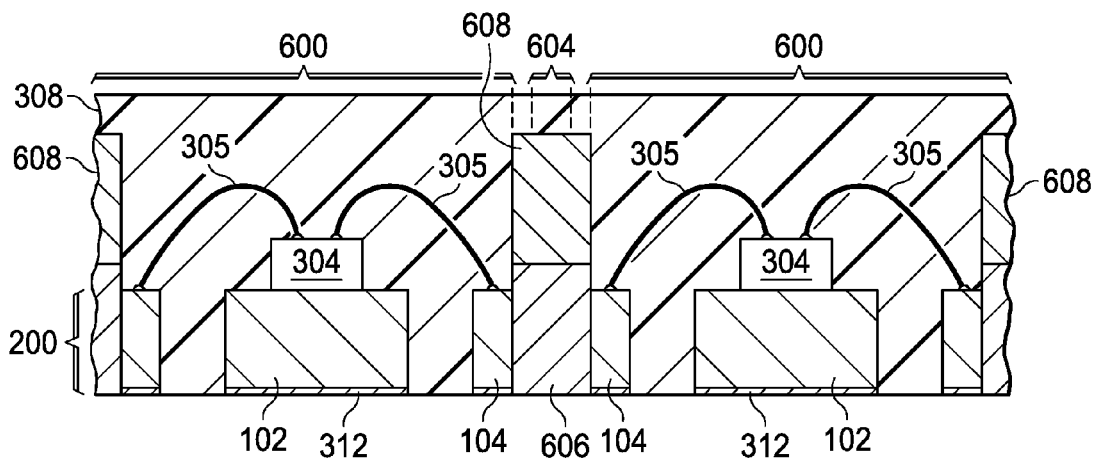
FIGS. 6A, 6B, and 6C describe a packaged IC with solderable sidewalls formed according to embodiments.
Figure 6B:
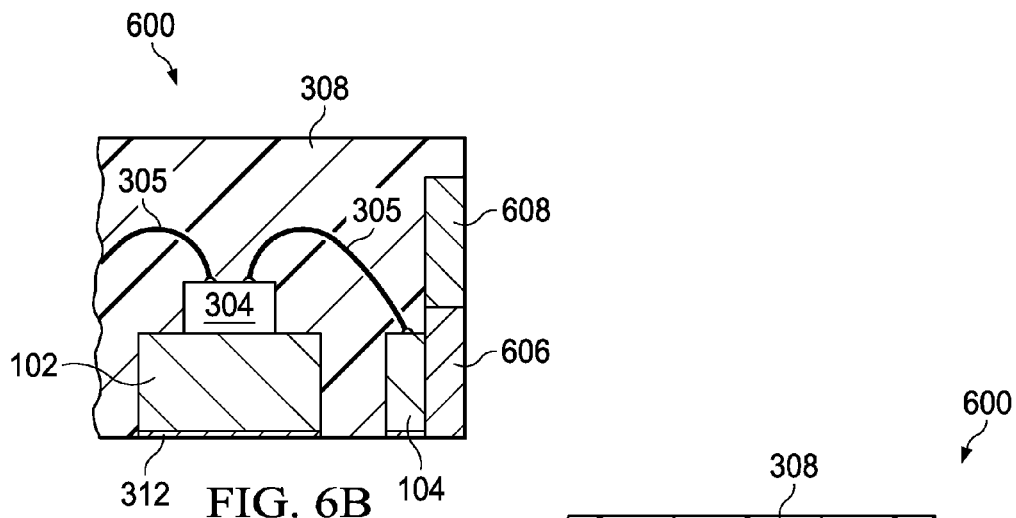

FIG. 6B shows a packaged wire bond IC 600 with a first solderable metal 606 on the sidewall of the wire bond pad 104 that is exposed during singulation and also with a second solderable metal 608 on a portion of the sidewall of the molding compound 308 that is exposed during singulation.

FIG. 6A shows a cross section of a lead frame strip 200 with packaged wire bond ICs 600 prior to singulation by sawing through the saw street 604. In this example, the saw street metal strip 204 (FIG. 3A) plus a portion of the wire bond pads 104 attached to opposite sides of the saw street metal strip 204 is replaced with a first solderable metal 606 forming a first solderable sidewall. In addition, a portion of the molding compound 308 in the saw street 604 and a portion of the molding compound on opposite sides of the saw street 604 are replaced with a second solderable metal 608 forming a second solderable sidewall.

Figure 6C:
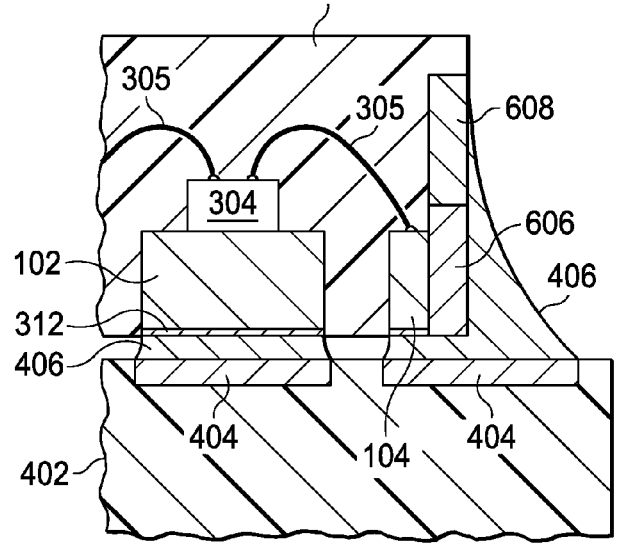

After singulation by sawing, as shown in FIG. 6B, the exposed sidewall of the packaged wire bond IC 600 is comprised primarily of first and second solderable metals, 606 and 608. These solderable metals, 606 and 608, readily wet and form strong solder joints 406 when the packaged wire bond IC 600 is attached to a circuit board 402 as shown in FIG. 6C. The first solderable sidewall formed of the first solder metal 606 plus the second solderable sidewall formed of the second solderable metal 608 provides an increased area for the solder to wet thus facilitating the formation of a larger and more robust solder joint 406 as is illustrated in FIG. 6C.

For illustration two different solderable metals, 606 and 608 are used to form a sidewall on a portion of the wire bond pad 104 and to form a sidewall on a portion of the molding compound 308. Alternatively, the first and second solderable metals, 606 and 608, may be the same solderable metal. One solderable metal that adheres to both the wire bond pad 104 and to the molding compound 308 may be used. An example ink or solderable screen print paste may have solderable metal particles suspended in a polyimide or epoxy resin or in a solder flux.

Figure 7A:
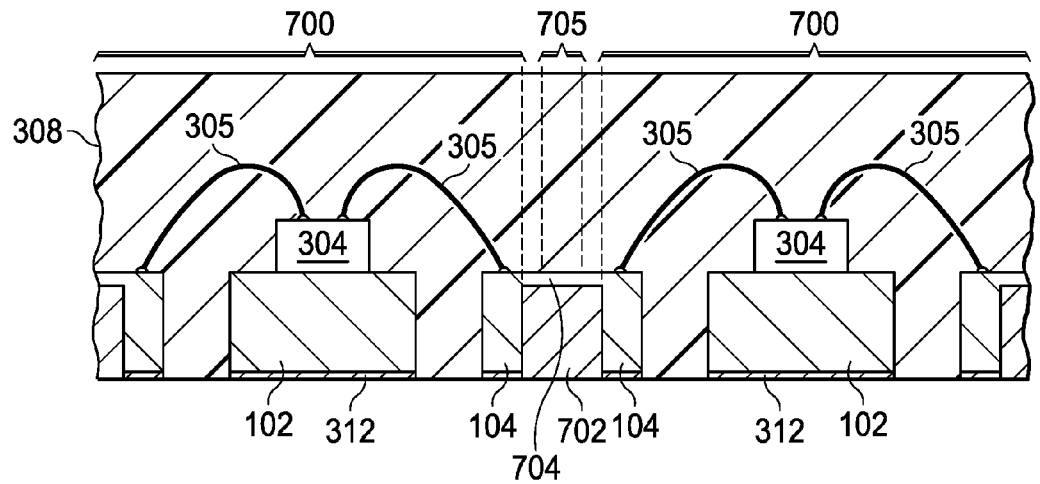
FIGS. 7A, 7B, and 7C describe a packaged IC with solderable sidewalls formed according to embodiments.
Figure 7B:
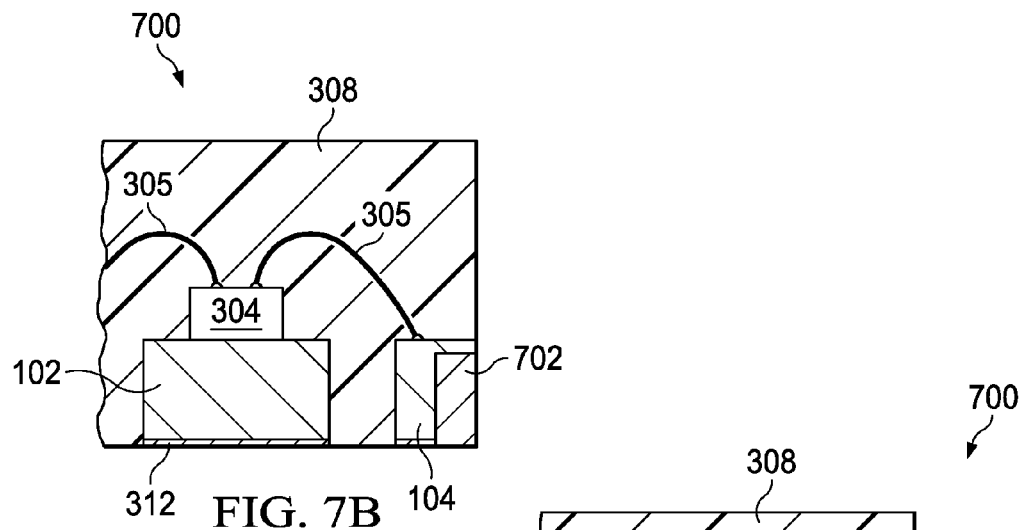
Figure 7C:
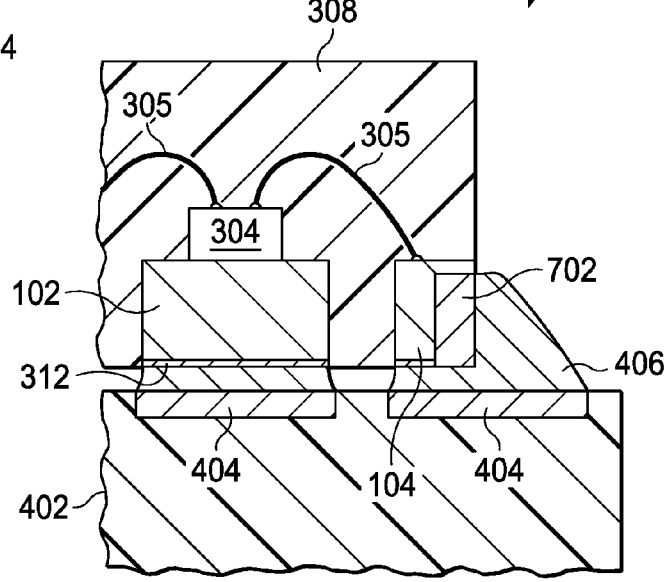

FIGS. 7A-7C illustrate an example where greater than about 0% and less than about 100% of the sidewall of the wire bond pad 104 that is exposed during singulation is covered with solderable metal 702. Unlike in FIGS. 5A and 6A where the wire bond pads are completely sawed through and replaced with a solderable metal; in this embodiment the saw street metal strip 204 and the wire bond pads 104 on opposite sides of the saw street metal strip 204 are partially sawed through and replaced with a solderable metal 702. Therefore, a partial saw street metal strip 704 remains between the wire bond pads 104. The partial saw street metal strip 704 preserves the adhesive bond between the molding compound 308, the solderable metal 702, and the wire bond pads 104 during encapsulation. The partial saw street metal strip 704 may also provide reinforcement that may reduce warpage during handing.

A method for forming the embodiment packaged wire bond IC 600 shown in FIG. 6C is described in the cross sections illustrating the major processing steps in FIGS. 8A through 8F. The embodiment is illustrated with a packaged wire bonded IC 600 but it generally applies to other packaged ICs such as packaged flip chip ICs.

Figure 8A:
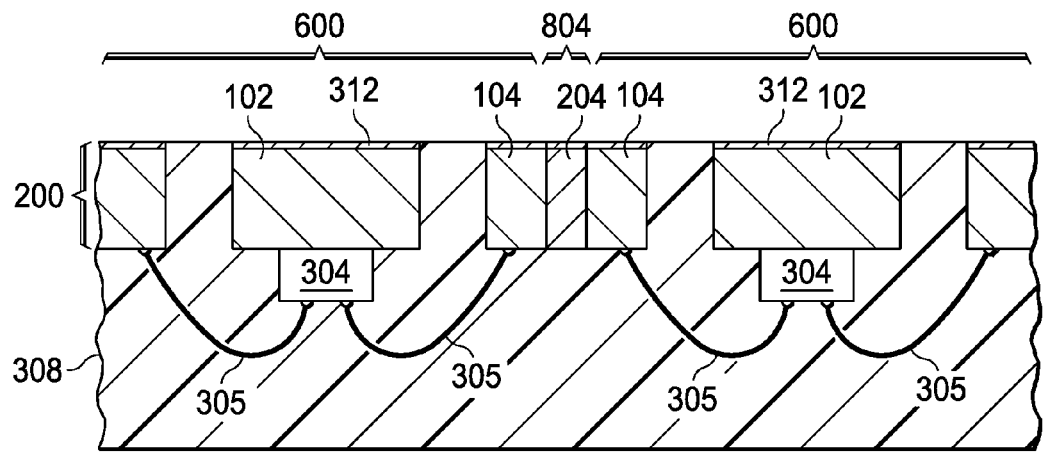
FIGS. 8A through 8F are cross sections of the packaged IC in FIG. 6B depicted in successive stages of fabrication.

FIG. 8A shows two packaged wire bond ICs 600. IC chips 304 are mounted on IC chip pads 102 in lead frame strip 200. Wire bonds 305 electrically connect the IC chips 304 to wire bond pads 104 also in the lead frame strip 200. Wire bond pads 104 from two adjacent lead frames 100 (FIG. 1A) are attached to opposite sides of the saw street metal strip 204. The IC chips 304, the wire bonds 305, the IC chip pads 102, the wire bond pads 104, and the saw street metal strips 204 are encapsulated in molding compound 308.

Figure 8B:
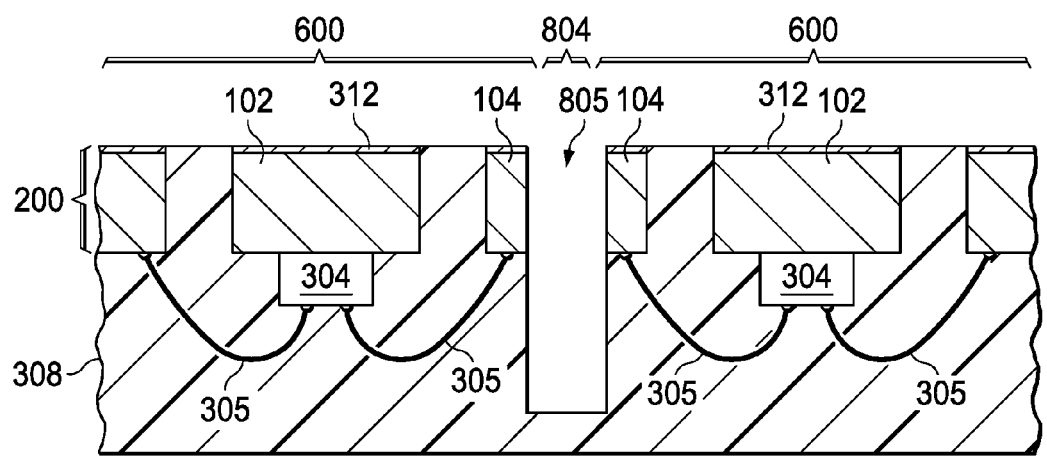

In FIG. 8B a trench 805 is cut through the saw street metal strip 204 and cut through portion of the wire bond pads 104 attached on opposite sides of the saw street metal strip 204. The trench 805 may also be cut through a portion of the molding compound 308. The trench 805 may be saw cut or laser cut for example. The trench 805 may be at least 0.01 mm per side wider than the saw street 804. In an example embodiment the trench 805 is 0.03 mm per side wider than the saw street 804.

Figures 1, 8C:
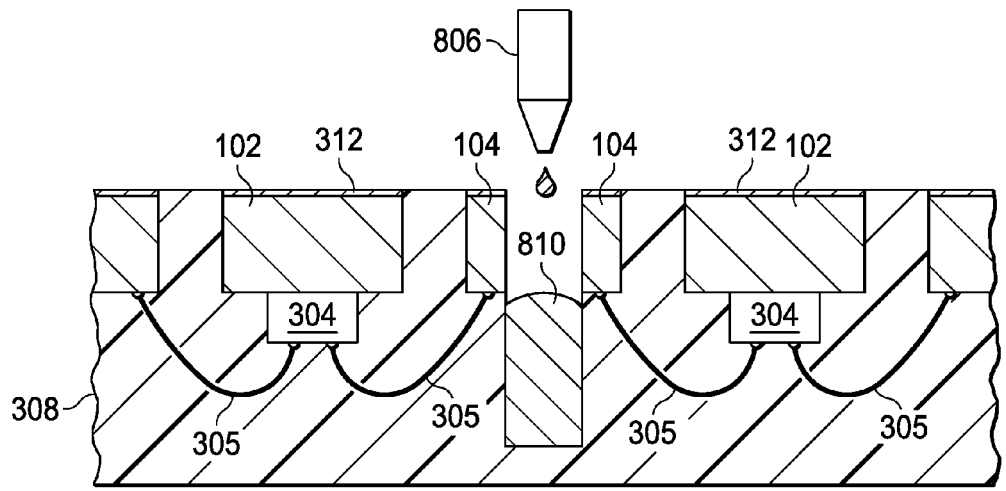

In FIG. 8C-1 the trench 805 is partially filled with a second solderable ink 810 using an ink jet printer 806. The second solderable ink 810 approximately fills the portion of the trench 805 cut into the molding compound 308. The second solderable ink 810 may contain solderable metal particles dispersed in a polyimide or epoxy resin or a solder flux, for example. The solderable metal particles may be a metal or metal alloy such as silver, silver-tin, solder, gold, nickel, platinum, palladium and alloys thereof.

Figures 2, 8C:
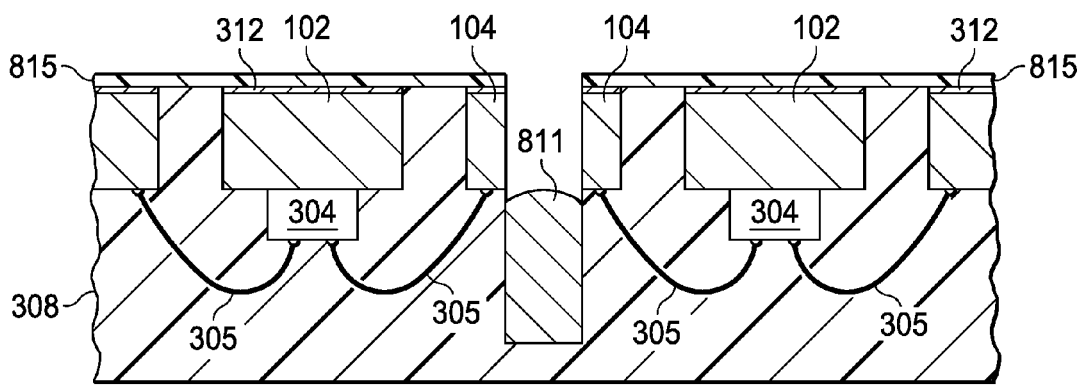

Alternatively as shown in FIG. 8C-2, a screen printing mask 815 may be used to screen print a second solderable screen print paste 811 to approximately fill the portion of the trench 805 cut into the molding compound 308. The second solderable screen print paste 811 may be a conductive solder paste designed to adhere to molding compound 308.

Figures 1, 8D:
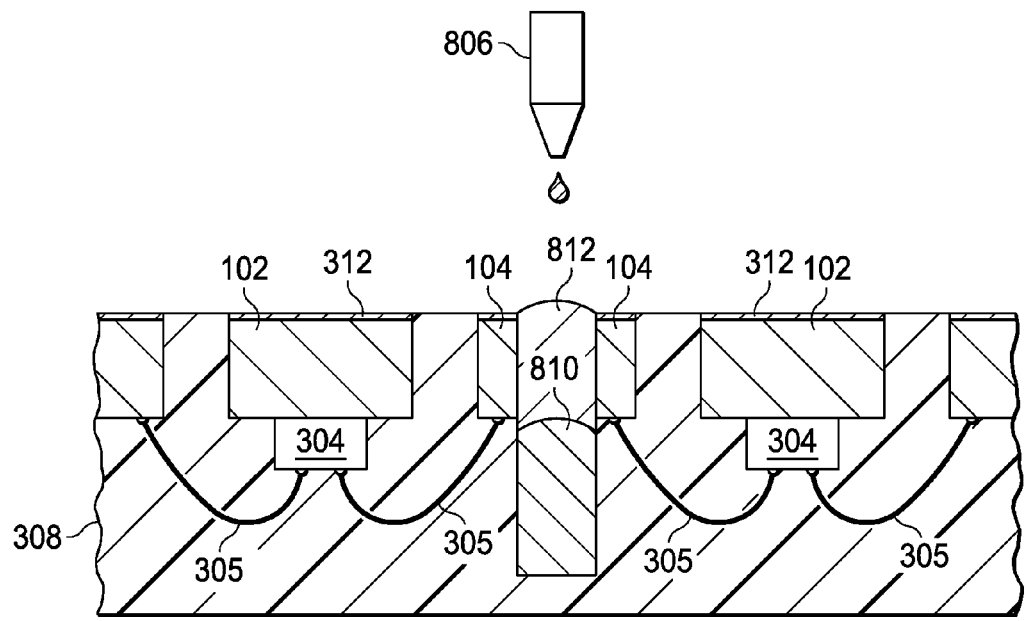
Figures 2, 8D:
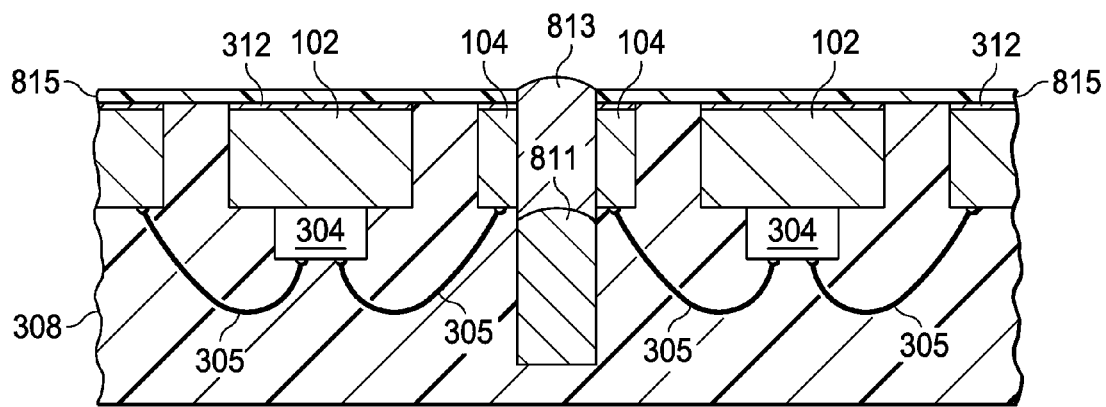

In FIG. 8D-1 the remainder of the trench 805 is approximately filled with a first solderable ink 812 using an ink jet printer 806. The first solderable ink 812 may be polyimide or epoxy resin containing solderable metal particles, may be an ink composed of powdered solder suspended in a flux, or it may be an ink composed of powdered solder plus solderable metal particles suspended in a flux. The solderable metal particles may be a metal or metal alloy such as silver, silver-tin, solder, gold, nickel, platinum, palladium and alloys thereof.

As shown in FIG. 8D-2, screen printing mask 815 may be used to screen print a first solderable screen print paste 813 to approximately fill the remainder of the trench 805.

Figure 8E:
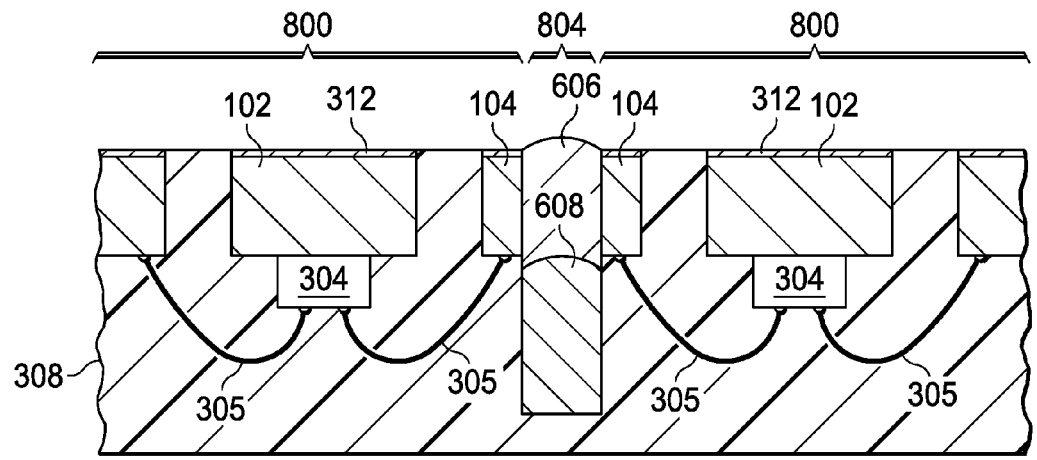

Referring now to FIG. 8E, the second and first solderable inks 810 and 812 or the second and first solderable screen print pastes, 811 and 813, may be annealed to evaporate solvent and to cause the inks or pastes to form first and second solderable metals, 606 and 608. The anneal temperature may be in the range of about 80° C. to 300° C., for example.

Figure 8F:
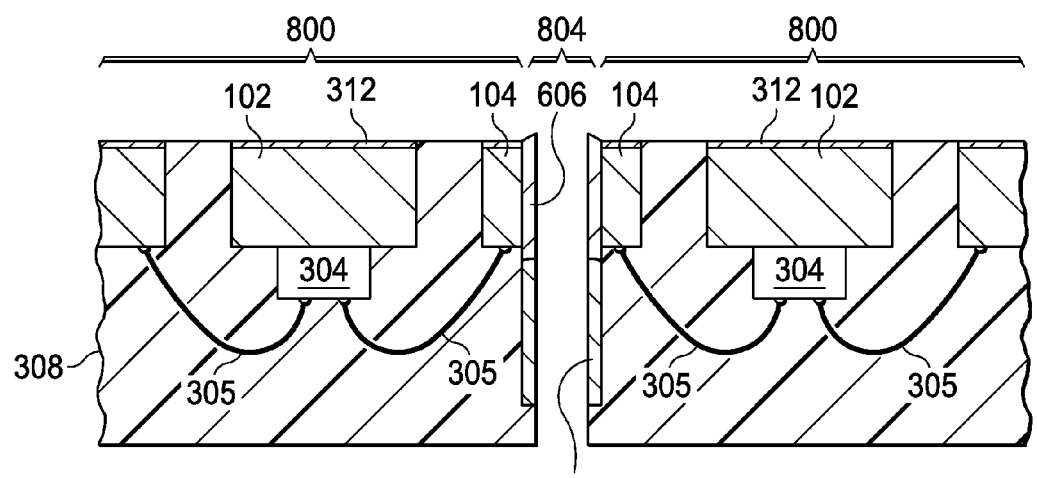

FIG. 8F shows the packaged wire bond ICs 800 after singulation by cutting through the saw street 804. The packaged wire bond ICs 800 have a first solderable sidewall composed of solderable metal 606 on the sidewalls of the wire bond pads 104 and second solderable metal 608 on a portion of the sidewalls of the molding compound 308.

The depth of the trench 805 may be varied as desired. The trench 805 may penetrate little into the molding compound 308, may penetrate through a majority of the molding compound 308, or may penetrate completely through the molding compound 308. Alternatively, one solderable ink or solderable screen print paste that adheres to both molding compound 308 and to wire bond pads 104 may be used to fill the trench 805 using a one-step fill operation.

With this embodiment when the packaged wire bond ICs 800 are singulated, no lead frame base metal of wire bond pads 104 is exposed. As illustrated in FIG. 6B, using this embodiment, the increased sidewall area that is provided by solderable metals 606 and 608 enables a larger, more robust solder joint 406 to be formed during attachment of the packaged wire bond IC 600 to a circuit board 402.

A method for forming the second embodiment packaged wire bond IC 700 shown in FIG. 7C, is described in the cross sections illustrating the major processing steps in FIGS. 9A through 9E. The embodiment is illustrated with a packaged wire bonded IC 700 but generally applies to all packaged ICs including packaged flip chip ICs.

Figure 9A:
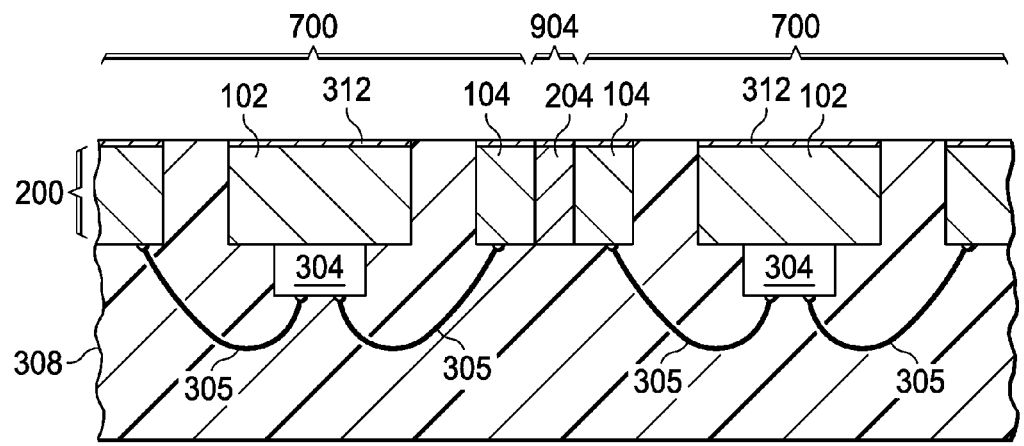
FIGS. 9A through 9E are cross sections of the packaged IC in FIG. 7B depleted in successive stages of fabrication.

FIG. 9A shows two packaged wire bond ICs 700 prior to singulation by sawing through saw street 904. IC chips 304 are mounted on lead frame IC chip pads 102 in lead frame strip 200. Wire bonds 305 electrically connect the IC chips 304 to wire bond pads 104 also in the lead frame strip 200. Wire bond pads 104 from two adjacent lead frames 100 (FIG. 1A) are attached to opposite sides of the saw street metal strip 204. The IC chips 304, the wire bonds 305, the IC chip pads 102, the wire bond pads 104, and the saw street metal strips 204 are encapsulated in molding compound 308.

Figure 9B:
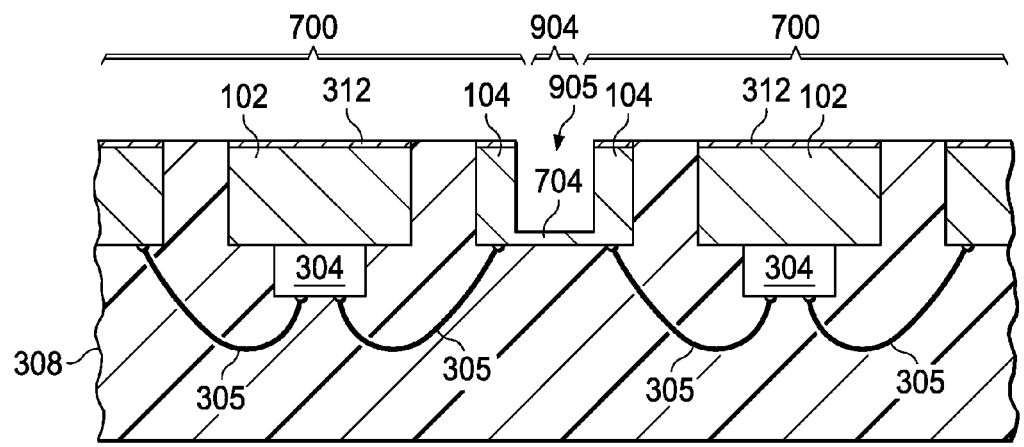

In FIG. 9B a trench 905 is cut part way through saw street metal strip 204 and part way through a portion of the wire bond pads 104 that are attached to opposite sides of the saw street metal strip 204. A partial saw street metal strip 704 remains between the two wire bond pads 104. The trench 905 may be cut by sawing or by cutting with a laser. The trench 905 may be at least 0.01 mm per side wider than the saw street 904. In an example embodiment the trench 905 is 0.03 mm per side wider than the saw street 904.

The trench 905 may be cut to a depth of between greater than about 0% and less than about 100% of the way through the saw street metal strip 204 and through a portion of the wire bond pads 104. In an example embodiment the trench 905 is cut through about 80% of the saw street metal strip 204.

Figures 1, 9C:
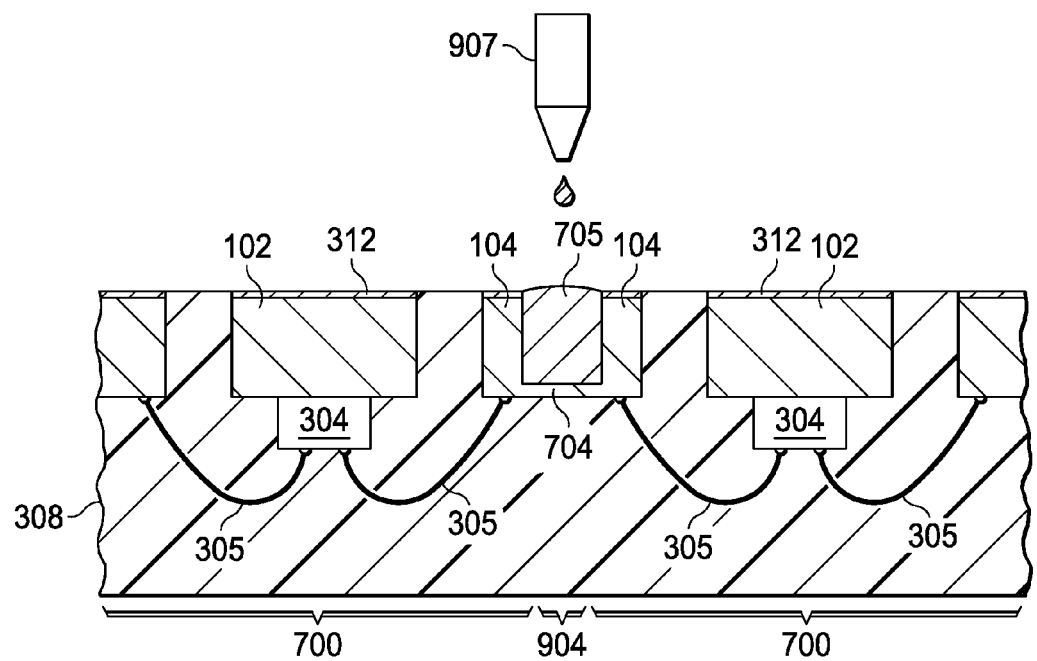
Figures 2, 9C:
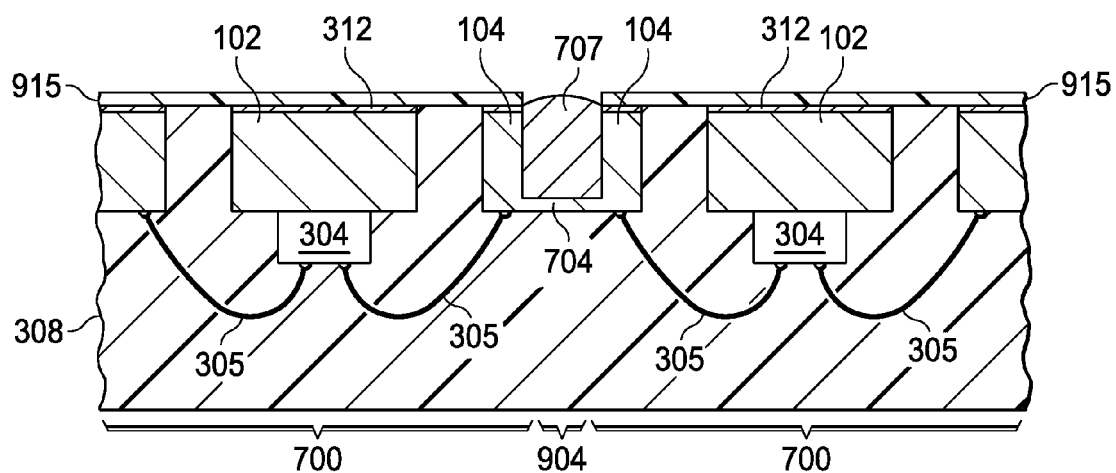

In FIG. 9C-1 the trench 905 is filled with a solderable ink 705 using an ink jet printer 904. The solderable ink 705 may be a solder paste or a solvent such as a polyimide or epoxy resin containing solderable particles comprised of a solderable metal or metal alloy such as silver, silver-tin, solder, gold, nickel, platinum, tin, palladium and alloys thereof.

Alternatively as shown in FIG. 9C-2, the trench 905 may be tilled with a solderable screen print paste 707 using a screen printing mask 915.

Figure 9D:
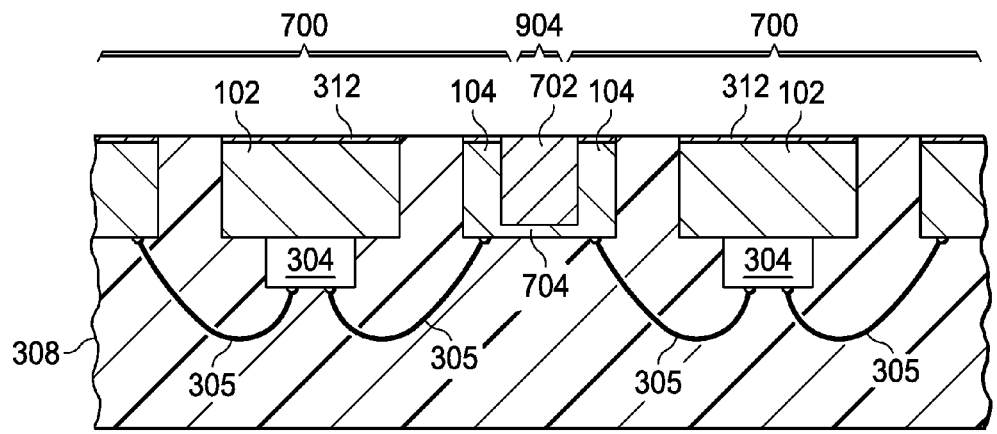

Referring now to FIG. 9D, the solderable ink 705 or solderable screen print paste 707 may be annealed to evaporate solvent and to cause the ink or solderable screen print paste to cure and reflow into a solderable metal 702 filling the trench 905. The thermal treatment may be in the range of about 80° C. to 300° C., for example.

Figure 9E:
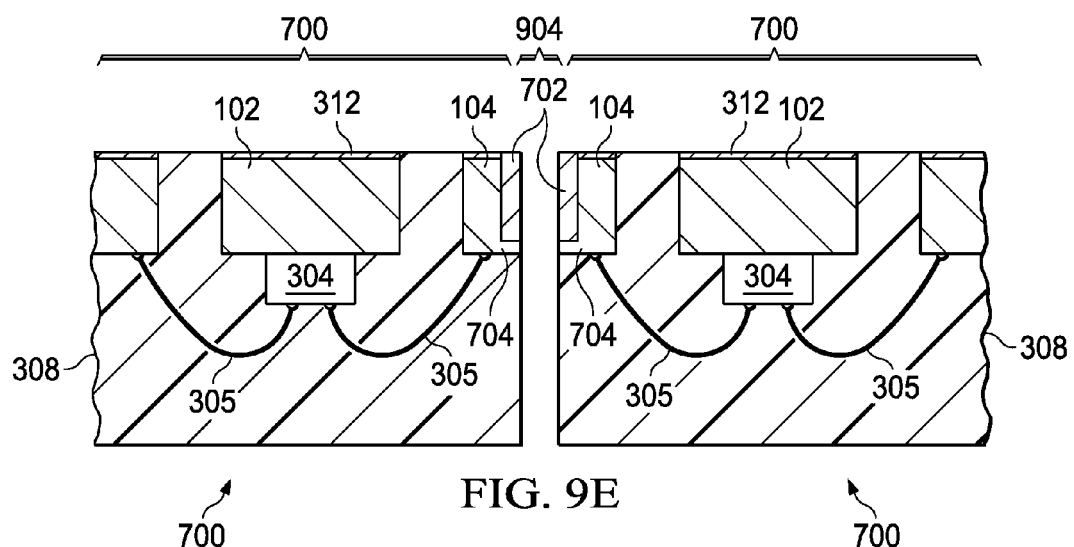

FIG. 9E shows two packaged wire bond ICs 700 after completing singulation by cutting through saw street 904. The packaged wire bond IC's 700 have solderable metal 702 formed on a portion of the sidewalls of the bond pads 104.

With this embodiment, between greater than about 0% and less than about 100% of the sidewall on the wire bond pad 104 that is exposed during singulation is composed of a solderable metal 702. As illustrated in FIG. 7B, using this embodiment, strong solder joints 406 may formed to the solderable metal 702 during the soldering of the packaged wire bond IC 700 to circuit board 402.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A method of forming packaged IC chips comprising:
   providing a lead frame strip having IC chip pads and wire bond pads, the IC chip pads being coupled to IC chips, the IC chips being separated by a saw street,the wire bond pads being coupled together by a saw street metal strip, and the lead frame strip being partially encapsulated with a molding compound;
   forming a trench that is wider than the saw street by cutting through the saw street metal strip, a portion of wire bond pads or flip chip pads attached to opposite sides of the saw street metal strip, and a portion the molding compound;
   partially filling the trench with a second solderable ink using an ink jet printer or a second solderable screen print paste using a screen printing mask;
   approximately filling the trench with a first solderable ink using the ink jet printer or a first solderable screen print paste using the screen printing mask;
   annealing the second and first solderable inks or the second and first solderable screen print pastes to form first and second solderable sidewalls; and singulating the packaged IC chips by cutting through the remainder of the saw street.

2. The method of claim 1, wherein the first and second solderable inks or the first and second solderable screen print pastes contains solderable metal particles selected from the group consisting of:
silver,
an alloy of silver,
tin,
an alloy of silver and tin,
an alloy of silver and tin and copper,
gold,
an alloy of gold and tin,
palladium
nickel
an alloy of nickel and palladium,
an alloy of nickel and palladium, and gold,
solder, and
platinum.

3. The method of claim 1, wherein the trench is at least 0.01 mm per side wider than the saw street.

4. The method of claim 1, wherein the annealing step is performed at a temperature in the range of about 80° C. to 300° C.

5. The method of claim 1, wherein the first and second solderable inks are the same and wherein the first and second solderable screen print pastes are the same.

6. The method of claim 1, wherein the trench is cut greater than about 0% to less than about 100% through the molding compound.

7. The method of claim 1, wherein the second solderable ink or the second solderable screen print paste approximately fills the portion of the trench cut into the molding compound.

8. The method of claim 1, wherein the first solderahle ink or the first solderable screen print paste approximately fills the trench.

9. A method of forming packaged IC chips comprising:
providing a lead frame strip having IC chip pads and wire bond pads, the IC chip pads being coupled to IC chips, the IC chips being separated by a saw street, the wire bond pads being coupled together by a saw street metal strip, and the lead frame strip being partially encapsulated with a molding compound;
cutting a trench that is wider than the saw street by cutting part way through the saw street metal strip and part way through a portion of the wire bond pads or the flip chip pads attached to opposite sides of the saw street metal strip;
filling the trench with a solderable ink using an ink jet printer or with solderable screen print paste using a screen printing mask;
thermal curing the solderable ink or solderable screen print paste; and
singulating the packaged IC chips by cutting through the remainder of the saw street.

10. The method of claim 9, wherein the solderable ink or solderable screen print paste contains particles comprised of a solderable metal or metal alloy selected from the group consisting of:
silver,
an alloy of silver,
tin,
an alloy of silver and tin,
an alloy of silver and copper and tin;
gold,
an alloy of gold and tin,
palladium
nickel
an alloy of nickel and palladium,
an alloy of nickel and palladium, and gold,
solder, and
platinum.

11. The method of claim 9, wherein the trench is at least 0.01 mm per side wider than the saw street.

12. The method of claim 9, wherein the trench depth is greater than about 0% and less than about 100% the thickness of the saw street metal strip.

* * * * *